United States Patent [19]

Yoshitake et al.

[11] Patent Number: 4,819,033
[45] Date of Patent: Apr. 4, 1989

[54] ILLUMINATION APPARATUS FOR EXPOSURE

[75] Inventors: Yasuhiro Yoshitake, Yokohama; Yoshitada Oshida, Fujisawa; Masataka Shiba; Naoto Nakashima, both of Yokohama, all of Japan

[73] Assignee: Hitachi, Ltd., Tokyo, Japan

[21] Appl. No.: 113,514

[22] Filed: Oct. 28, 1987

[30] Foreign Application Priority Data

Oct. 29, 1986 [JP] Japan .................... 61-255624

[51] Int. Cl.⁴ ................... G03B 27/42; G03B 27/72
[52] U.S. Cl. .......................... 355/53; 355/67; 355/69
[58] Field of Search .................... 355/53, 54, 67, 69

[56] References Cited

U.S. PATENT DOCUMENTS 4,619,508  10/1982  Shibuya et al. ............... 355/67 X
4,624,551  11/1986  Anzai et al. .................. 355/53

FOREIGN PATENT DOCUMENTS 57-198631  12/1982  Japan .
60-247643  12/1985  Japan .

OTHER PUBLICATIONS

SPIE-vol. 174, Development in Semiconductor Microlithography IV, 1979, pp. 28-35.

Primary Examiner—L. T. Hix
Assistant Examiner—R. Rutledge
Attorney, Agent, or Firm—Antonelli, Terry & Wands

[57] ABSTRACT

An illumination apparatus is disclosed which is suitable for use in a projection/exposure system for projecting an image of a circuit pattern of a reticle on a semiconductor wafer through a projection lens. The illumination apparatus includes an excimer laser for emitting a pulsed laser beam, an optical system for illuminating the reticle with a plurality of laser pulses emitted from the excimer laser so that laser pulses having passed through the reticle impinge on the semiconductor wafer in different directions through the projection lens, and a light intensity control device for controlling the light intensity of each of the laser pulses so that the laser pulses equally contribute to the reaction of a light sensitive material which is provided on the semiconductor wafer, with light.

8 Claims, 5 Drawing Sheets

F I G. 7
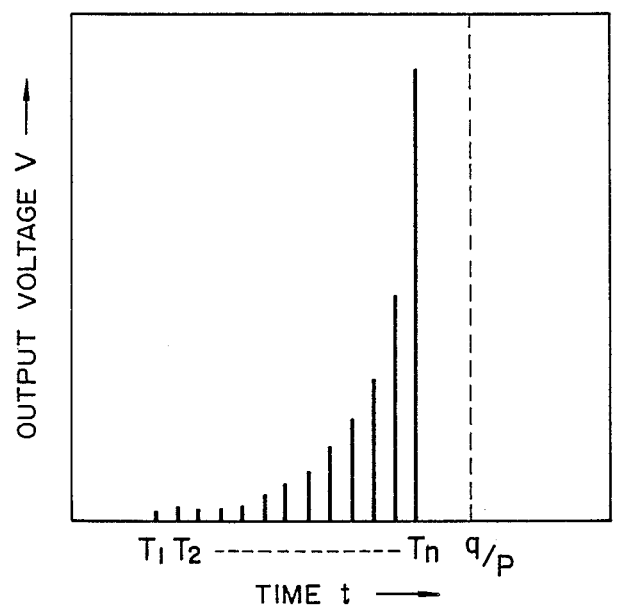

ILLUMINATION APPARATUS FOR EXPOSURE

BACKGROUND OF THE INVENTION

The present invention relates to a semiconductor exposing system, and more particularly to an illumination apparatus for exposure which includes an excimer laser and is suited to form a high-resolution image of a fine pattern.

As semiconductor devices are made high in integration density and have a fine circuit pattern, attention is paid to the use of a laser capable of emitting a pulsed light beam of far ultraviolet region such as an excimer laser, as a light source for exposure. Such a light source is disclosed in a Japanese Patent application JP-A No. 57-198,631. The laser beam emitted from an injection locked excimer laser is high in energy density and narrow in spectral width. Further, this laser beam has a single transverse mode and high spatial coherency.

Accordingly, a wavefront distorted irregularly by the imperfections of various optical elements will produce an irregular interference pattern (which is called "speckle") on a projected image. Two methods for eliminating the above speckle have been proposed. In one of the methods, as described in Japanese Patent Applications JP-A No. 60-230,629 and JP-A No. 60-247,643, an optical member for generating an optical path difference greater than coherent length is disposed on an optical path. In the other method, as described on page 35 of the SPIE, Vol. 174, "Development in Semiconductor Microlithography" IV, 1979, a laser beam is deflected successively by means of an optical deflector, and a plurality of laser pulses which are different in deflection angle from one another (directional light pulses) are successively impinged upon a receiving surface to superpose plural different speckles, and consequently, the uniformity of illumination on the receiving surface is improved In the former method, the optical member for generating an optical path difference is formed of a bundle of a plurality of square pillar prisms or optical fibers different in length. The laser beam emitted from an injection locked excimer laser has a coherent length of about 30 cm. In order to make the optical path difference between adjacent two of optical elements used more than 30 cm, the optical member for generating an optical path difference is required to be very large in size. On the other hand, the latter method has an advantage that an optical system used is relatively compact. In the latter method, however, no regard has been paid to the degree of contribution of each of a plurality of laser pulses which are used for one exposure operation, to the reaction of a light sensitive material with light.

The light sensitive material concentration which has not yet reacted with light, varies with exposure to light in accordance with the following equation:

$$\frac{dM}{dt} = -kM\sqrt{I} \qquad (1)$$

where M indicates the concentration which has not yet reacted with light, t an exposure time, k a constant, and I the intensity of light.

In a case where the light intensity I is kept constant, the equation (1) is rewritten as follows:

$$M = C\exp(-k\sqrt{I}\,t) \qquad (2)$$

where C is a constant.

FIG. 5 is a graph showing an M-t curve which is obtained from the equation (2). Referring to FIG. 5, the exposure time elapses in order of $t_1$, $t_2$, $t_3$ and $t_4$, and a time interval between the time moments $t_1$ and $t_2$ is made equal to a time interval between the time moments $t_3$ and $t_4$. As is apparent from FIG. 5, a change in concentration M in the time interval between $t_3$ and $t_4$ is far smaller than a change in concentration M in the time interval between $t_1$ and $t_2$, that is, the reaction of the light sensitive material with light is weakened with exposure time elapsing. Accordingly, in a case where a plurality of light pulses are used in a single exposure operation, the picture quality of an image formed on a light receiving surface is greatly affected by speckles due to several initial directional light pulses.

That is, in the latter method which uses a plurality of light pulses for a single exposure operation, no regard has been paid to a fact that the reaction of the light sensitive material with a light pulse weakens as the light pulse is received later, and thus there arises a problem that a developed pattern on a semiconductor wafer is strongly affected by speckles due to several initial directional light pulses

SUMMARY OF THE INVENTION

It is accordingly an object of the present invention to provide an illumination apparatus for exposing a light sensitive material to a plurality of light pulses in one exposure operation so that the light pulses equally contribute to the reaction of the light sensitive material with light, to make it possible to print a high-resolution image of a fine pattern having a line width of 0.5 m or less on a semiconductor wafer.

In order to attain the above object, according to the present invention, there is provided an illumination apparatus suitable for use in a projection/exposure system for projecting a reduced image of a circuit pattern of a reticle on a light sensitive material through a reduction/projection lens, which apparatus comprises: an excimer laser for emitting a pulsive laser beam; a light quantity intensity device for controlling the light quantity of each of laser pulses emitted from the excimer laser; and an optical system for illuminating a reticle uniformly with each of laser pulses having been controlled by the light intensity control device.

In the light intensity control device, the light quantity of each laser pulse is increased in accordance with a decrease in sensitivity of the light sensitive material with exposure time. That is, data on the sensitivity reduction with exposure time is previously prepared, and the light intensity control device is operated on the basis of the above data. It is to be noted that the above data varies depending upon the kind of the light sensitive material. According to such a method, laser pulses used in one exposure operation equally contribute to the reaction of the light sensitive material, and thus the picture quality of an image which is formed by developing the light sensitive material, is scarcely affected by speckles.

BRIEF DESCRIPTION OF THE DRAWINGS

FIG. 7 is a graph showing an example of a light intensity control method according to the present invention.

DESCRIPTION OF THE PREFERRED EMBODIMENT

Now, an embodiment of an illumination apparatus for exposure according to the present invention will be explained below, with reference to the drawings.

Figure 1:
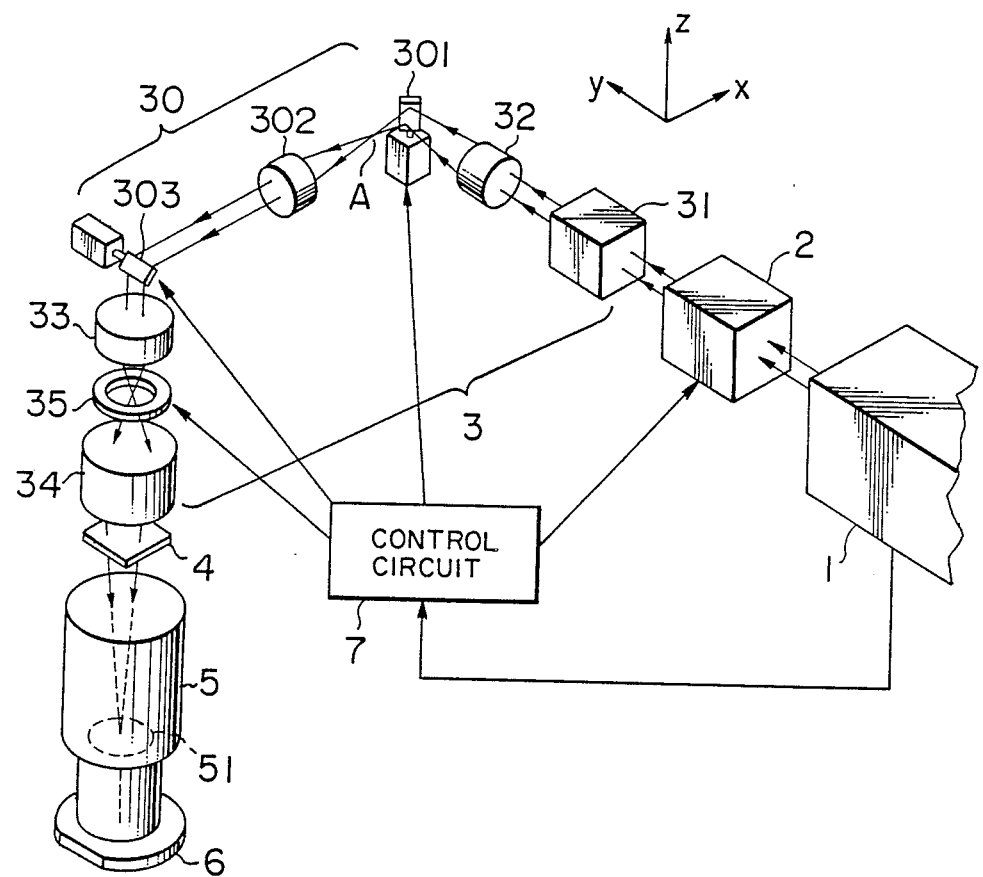
FIG. 1 is an arrangement plan showing the whole construction of a semiconductor exposing system which includes an embodiment of an illumination apparatus according to the present invention.
Figure 2:
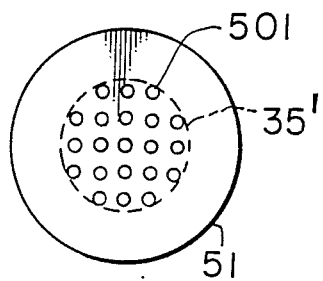
FIG. 2 is a schematic diagram showing the laser spot distribution at the entrance pupil of the reduction/projection lens of FIG. 1.
Figure 3:
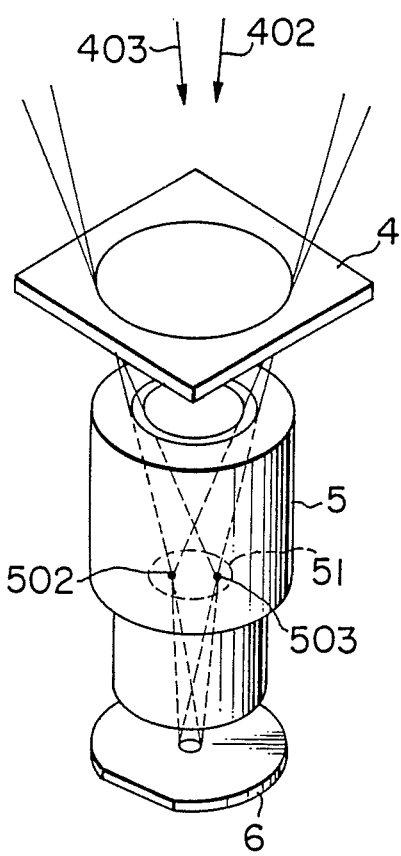
FIG. 3 is a schematic diagram which shows in detail an image formation system formed by the reduction/projection lens of FIG. 1.

FIG. 1 shows the whole construction of a semiconductor exposing system which includes the present embodiment. In FIG. 1, reference numeral 1 designates an excimer laser, 2 a light intensity control device, which is a substantial part of an illumination apparatus according to the present invention, 3 an optical system for deflecting laser pulses from the control device 2, 4 a reticle which is formed by depicting a circuit pattern on a silica glass plate, 5 a reduction/projection lens, 6 a semiconductor wafer, and 7 a control circuit for controlling the above-mentioned parts 1, 2 and 3. Referring to FIG. 1, laser pulses emitted from the excimer laser 1 pass through the optical system 3, after the light intensity of each laser pulse has been controlled by the light intensity control device 2. The reticle 4 is uniformly illuminated with each laser pulse from the optical system 3, and an image of the circuit pattern of the reticle 4 is formed on a light sensitive material which is applied to the wafer 6. The optical system 3 is constructed as mentioned below. The intensity of the laser beam emitted from the laser 1 is small at a central portion of the laser beam, and hence the intensity distribution of the laser beam is made uniform by a beam equalizer 31. For example, in the beam equalizer 31, the laser beam is split into four parts, and the parts are combined in the vicinity of a galvano-mirror 301 after being passed along different from paths the distance of which are different one another by greater than the coherent length so as to reduce the spatial coherence of the resultant laser beam and to make the energy density distribution therein uniform. The laser beam from the beam equalizer 31 is focused on a point A by a focusing lens 32. The galvano-mirror 301 is disposed between the focusing lens 32 and the point A, to deflect the laser beam in an X-Y plane. A first lens 302 is disposed so that the laser beam reflected from the mirror 301 passes through the first lens 302, and the focal point thereof on the front side agrees with the point A. Further, another galvano-mirror 303 is disposed so that the laser beam having passed through the first lens 302 impinges on the mirror 303 and an image of the mirror 301 is formed on the mirror 303. Thus, the laser beam having passed through the first lens 302 is composed of parallel rays, and impinges on the same portion of the mirror 303 independently of the rotational angle of the mirror 301. The galvano-mirror 303 turns on an axis parallel to a Y-axis. Further, second and third lenses 33 and 34 are disposed so that the image of the point A is formed at an aperture stop 35 and at the entrance pupil 51 of the reduction/projection lens 5, and each of the galvano-mirrors 301 and 303 is conjugate to the pattern-including surface (that is, lower surface) of the reticle 4. Accordingly, when the emission of laser pulses from the excimer laser 1 is synchronized with the deflection of each of the galvano-mirrors 301 and 303 by the control circuit 7, the images of the point A corresponding to the laser pulses, as shown in FIG. 2, are formed at points 501 on the entrance pupil 51. As shown in FIG. 3, incident light beams 402 and 403 on the reticle 4 corresponding to image points 502 and 503 on the entrance pupil 51 are different in traveling direction from each other. Accordingly, when a plurality of laser pulses are used for one exposure operation, speckles which are generated on the wafer 6 by the laser pulses having different traveling directions, will be compensated with one another.

Figure 4:
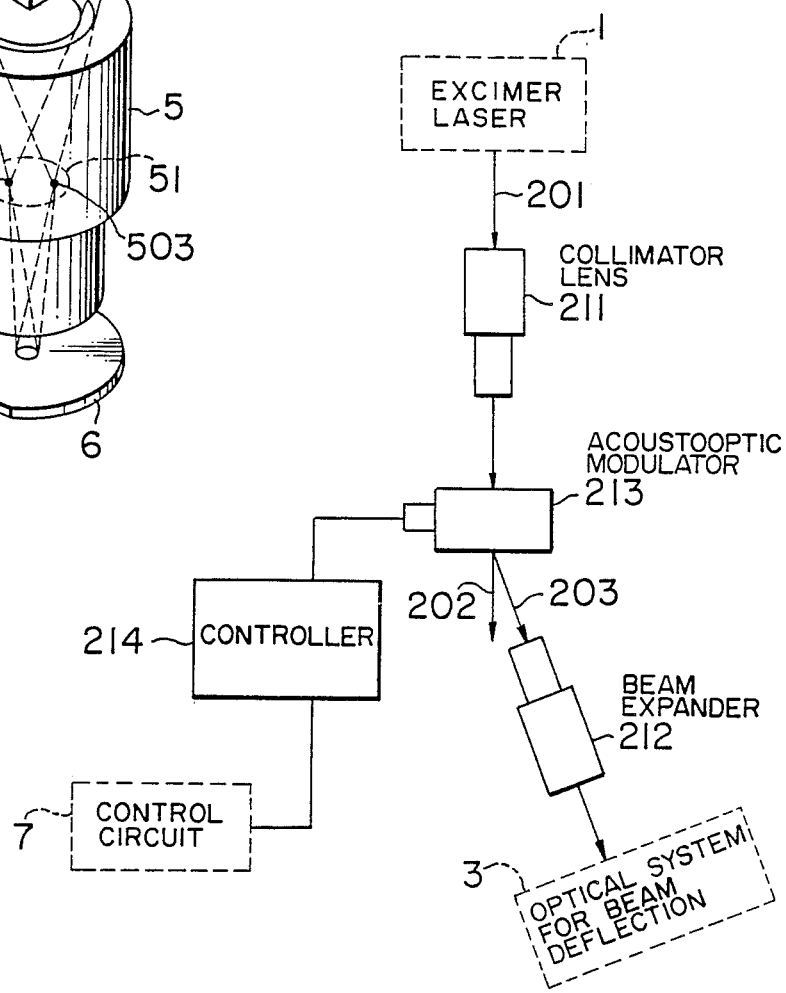
FIG. 4 is a block diagram showing an example of the light intensity control device which is shown in FIG. 1 and is the main gist of the present invention.

FIG. 4 shows an example of the light intensity control device 2 of FIG. 1. In FIG. 4, reference numeral 211 designates a collimator lens, 212 a beam expander, 213 an acoustooptic (A/0) modulator, and 214 a controller for controlling the modulator 213 by applying a variable voltage thereto. Referring to FIG. 4, a laser beam 201 emitted from the excimer laser 1 is converted by the collimation lens 211 into a fine beam, and then impinges on the acoustooptic modulator 213. The modulator 213 is made of silica glass, Fluorite or the like. When the modulator 213 is applied with an ultrasonic wave, the refractive index of the modulator 213 varies regularly on the basis of the photoelastic effect, and the zero-th order light 202 and the first-order diffracted light 203 are emitted from the modulator 213. The intensity of the first-order diffracted light 203 is controlled by a voltage which is supplied from the controller 214 to the modulator 213. The first-order diffracted light 203 is converted by the beam expander 212 into a thick beam, and then passes through the optical system 3 of FIG. 1.

Figure 5:
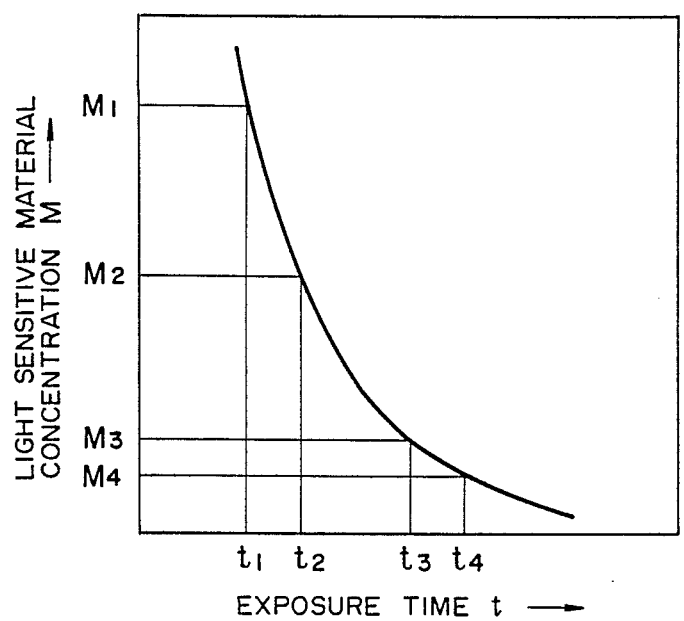
FIG. 5 is a graph showing a relation between the exposure time t and the concentration M concerning that portion of a light sensitive material which has not yet reacted with light, for a case where the intensity of light incident on the light sensitive material is not controlled.

As can be seen from FIG. 5, when a plurality of laser pulses from the optical system 3 successively impinge on a light sensitive material through the reticle 4 while keeping the intensity I of laser pulse constant, a pattern image obtained by developing the light sensitive material will be greatly affected by speckles generated by several initial directive laser pulses. Hence, the intensity I of laser pulse is controlled so that the light sensitive material concentration M which has not yet reacted with light, varies linearly with an exposure time t and thus the laser pulses equally contribute to the reaction of the light sensitive material with light. The linear variation of the concentration M with the exposure time t is expressed by the following equation:

$$M = -pt + q \tag{3}$$

where p and q are greater than zero, and t is less than a ratio q/p.

Figure 6:
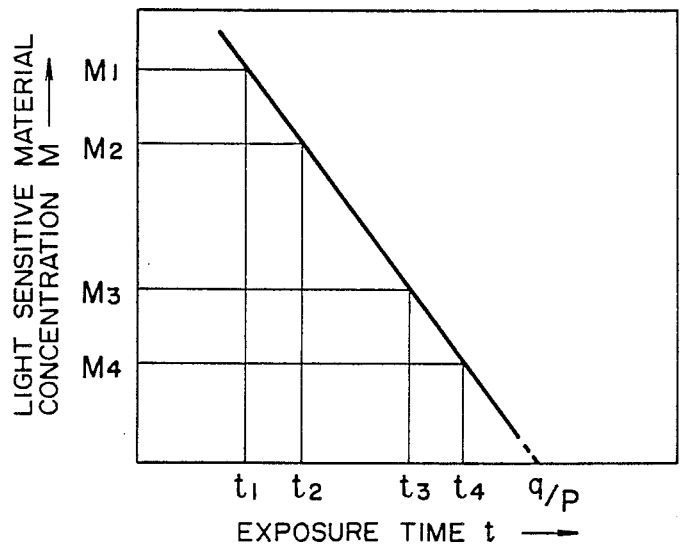
FIG. 6 is a graph showing a relation between the exposure time t and the concentration M concerning that portion of a light sensitive material which has not yet reacted with light, for a case where the intensity of light incident on the light sensitive material is controlled in accordance with the present invention.

FIG. 6 is a graph which shows an M-t line obtained from the equation (3). Referring to FIG. 6, the exposure time t elapses in order of $t_1$, $t_2$, $t_3$ and $t_4$. When a time interval $t_2 - t_1$ is made equal to a time interval $t_4 - t_3$, a change of the concentration M in the time interval $t_2 - t_1$ (namely, $M_1 - M_2$) is equal to a change of the concentration M in the time interval $t_4 - t_3$ (namely, $M_3 - M_4$). Thus, the laser pulses can equally contribute to the reaction of the light sensitive material with light. In order to obtain such a linear variation of the concentration M with the exposure time t, the intensity I of laser pulse is controlled in accordance with the following equation:

$$I = \frac{1}{k^2} \left( \frac{1}{t - \frac{q}{p}} \right)^2 \quad (4)$$

where t is less than the ratio q/p.

As has been already mentioned, the intensity I of laser pulse can be controlled by an output voltage from the controller 214 of FIG. 4. FIG. 7 shows the output voltage of the controller 214 at time moments $T_1$, $T_2$, ... and $T_n$ when laser pulses are emitted from the excimer laser 1. That is, when the output voltage of the controller 214 applied to the acoustooptic modulator 213 is varied as shown in FIG. 7, the laser pulses can equally contribute to the reaction of the light sensitive material with light.

Figure 8:
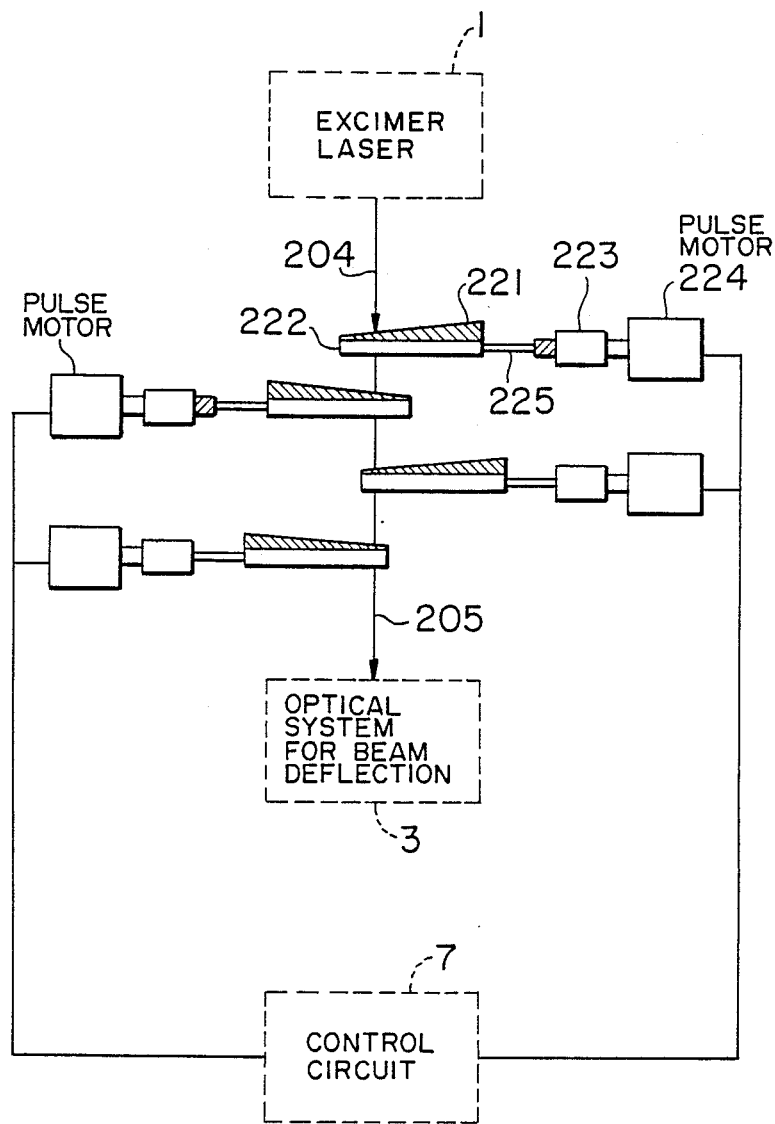
FIG. 8 is a block diagram showing another example of the light intensity control device of FIG. 4.

FIG. 8 shows another example of the light intensity control device 2 of FIG. 1. In FIG. 8, reference numeral 221 designates a wedge-shaped aluminum film, 222 a synthetic quartz plate, 223 a gear joint, 224 a pulse motor, and 225 a connecting rod. Referring to FIG. 8, a pulsed laser beam 204 emitted from the excimer laser 1 passes through a filter which is made up of the wedge-shaped aluminum film 221 and the synthetic quartz plate 222. When the quartz plate 222 is moved, the thickness of that portion of the aluminum film 221, through which the laser beam passes, is varied. The light transmittance of the aluminum film is inversely proportional to the thickness of a light transmitting portion thereof. Accordingly, the quantity of light having passed through the edge-shaped aluminum film 221 and the quartz plate 222 can be controlled by moving the quartz plate 222. One end of the connecting rod 225 is attached to the quartz plate 222, and the other end of the rod 225 is mounted with a worm gear, which is connected to the pulse motor 224 through the gear joint 223. Hence, the quartz plate 222 can be moved by starting the pulse motor 224. In order to finely control the intensity of light incident on the optical system 3, a plurality of optical units each made up of the wedge-shaped aluminum film 221, the synthetic quartz plate 222, the connecting rod 225, the gear joint 223 and the pulse motor 224, are disposed on the optical path between the excimer laser 1 and the optical system 3, as shown in FIG. 8, and each pulse motor is controlled by the control circuit 7 so that the intensity I of a pulsed output beam 205 is varied in accordance with the equation (4).

Alternatively, a plurality of optical units each made up of a polarizer, a belt, a pulley and a pulse motor, may be disposed in the above-mentioned manner. In this case, the plane of polarization of each polarizer is rotated so that the intensity I of a pulsed output beam is varied in accordance with the equation (4).

As has been explained in the foregoing, according to the present invention, a plurality of laser pulses which are successively emitted from a pulsed oscillation laser such as an excimer laser and are used to perform an exposure operation for a light sensitive material on a semiconductor wafer, can equally contribute to the reaction of the light sensitive material with light. Accordingly, a pattern image obtained by developing the light sensitive material is not affected greatly by speckles generated by several initial directive laser pulses, but speckles due to all the laser pulses are compensated with one another. Thus, a high-resolution image of a circuit pattern having a line width of 0.5 μm or less can be formed on the semiconductor wafer.

We claim:

1. An illumination apparatus suitable for use in a projection/exposure system for projecting an image of a circuit pattern of a reticle on a semiconductor wafer through a projection lens, said illumination apparatus comprising:

an excimer laser for emitting a pulsed laser beam;

an optical system for illuminating the reticle with a plurality of laser pulses emitted from the excimer laser so that laser pulses having passed through the reticle impinge on the semiconductor wafer in different directions, through the projection lens; and light intensity control means for controlling the light intensity of each of the laser pulses so that the amount of light reaction of a light sensitive material provided on the semiconductor wafer with each of the laser pulses is constant.

2. An illumination apparatus according to claim 1, wherein the light intensity control means includes a collimator lens, a beam expander, an acoustooptic modulator, and controller means for controlling the acoustooptic modulator.

3. An illumination apparatus according to claim 2, wherein the acoustooptic modulator is composed of a photoelastic member, the refractive index of which varies regularly on the basis of the photoelastic effect when an ultrasonic wave is applied thereto.

4. An illumination apparatus according to claim 1, wherein the optical system includes a beam equalizer, a focusing lens, an X-Y deflector, a first lens, another deflector, a second lens, an aperture stop, and a third lens.

5. An illumination apparatus according to claim 1, wherein the light intensity control means comprises:

an optical element which is disposed on the path of the pulsed laser beam and has gradually changing thickness, the quantity of the transmitted light being changed in dependence upon the thickness; and driving means which controllably moves the optical element in relation to an optical axis of the pulses laser beam.

6. An illumination apparatus according to claim 5, wherein the optical element is a wedge-shaped aluminum film formed on a synthetic quartz plate.

7. An illumination apparatus according to claim 5, wherein the optical element and the drive means make up an optical unit, and a plurality of optical units are disposed in line on the optical axis of the pulsed laser beam.

8. An illumination apparatus according to claim 3, where in the photoelastic member is composed of silica glass.

* * * * *